United States Patent [19]

Ahmed

[11] 3,979,606

[45] Sept. 7, 1976

[54] CURRENT LEVEL DETECTOR

[75] Inventor: Adel Abdel Aziz Ahmed, Annandale, N.J.

[73] Assignee: RCA Corporation, New York, N.Y.

[22] Filed: Sept. 5, 1975

[21] Appl. No.: 610,672

[52] U.S. Cl. .............................. 307/235 T; 307/296
[51] Int. Cl.[2] ........................................... H03K 5/20
[58] Field of Search ......... 307/235 R, 235 J, 235 N, 307/235 T, 235 W, 296; 330/30 D; 328/115–117, 151

[56] References Cited

UNITED STATES PATENTS

| | | | |
|---|---|---|---|
| 3,648,069 | 3/1972 | Frederiksen | 307/235 T |
| 3,760,194 | 9/1973 | Lutz et al. | 307/235 T |
| 3,868,517 | 2/1975 | Schoeff | 307/235 T |
| 3,872,323 | 3/1975 | Frederiksen et al. | 307/235 T |

*Primary Examiner*—John Zazworsky
*Attorney, Agent, or Firm*—H. Christoffersen; S. Cohen; K. Watov

[57] ABSTRACT

At least two current mirrors, both responsive to the same input current, the output transistor of the first serving as a current sink for the output current supplied by the second. At least the first mirror is a two-ratio mirror, its output current demand increasing at a rate within the output current supply capacity of the second in a first input current range and increasing at a rate faster than the rate of increase of the output current of the second mirror in a second input current range. A signal detector coupled to the output circuits of both mirrors indicates when the input signal current reaches a given level by detecting when current demanded by said sink exceeds the output current of the second mirror.

24 Claims, 10 Drawing Figures

CURRENT LEVEL DETECTOR

This invention relates to signal magnitude detectors, and particularly to signal current level detectors.

There are many circuits available for indicating when a voltage reaches (in either direction) given threshold level(s). The present application is directed to circuits for performing the same function for currents. These circuits are especially suitable for implementation in integrated circuit form.

Circuits embodying the present invention include a current sink controlled by the signal current for demanding a current in one proportion to the signal current, when the latter is lower than a given value, and in another proportion to the signal current, when the latter is greater than the given value. They also include a current source controlled by the signal current, for supplying a current to the current sink in at least one proportion to the signal current. An auxiliary current source is responsive to the current sink demanding more current than the current source can supply, for providing at least a portion of the additional current demanded by the current sink. An output signal is provided by a means responsive to operation of the auxiliary current source.

IN THE DRAWINGS

Figure 6A:
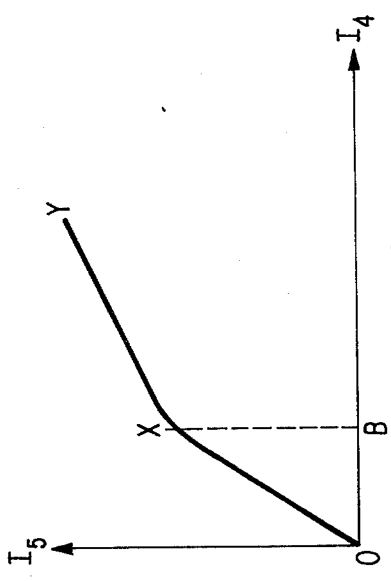
Figure 6B:
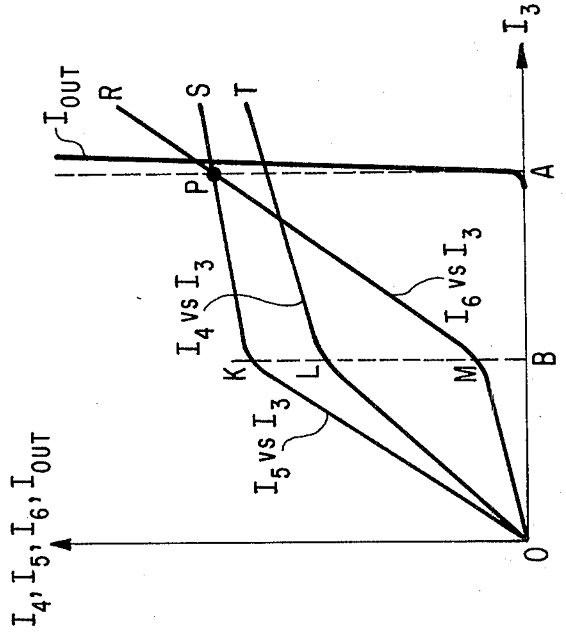
Figure 7:
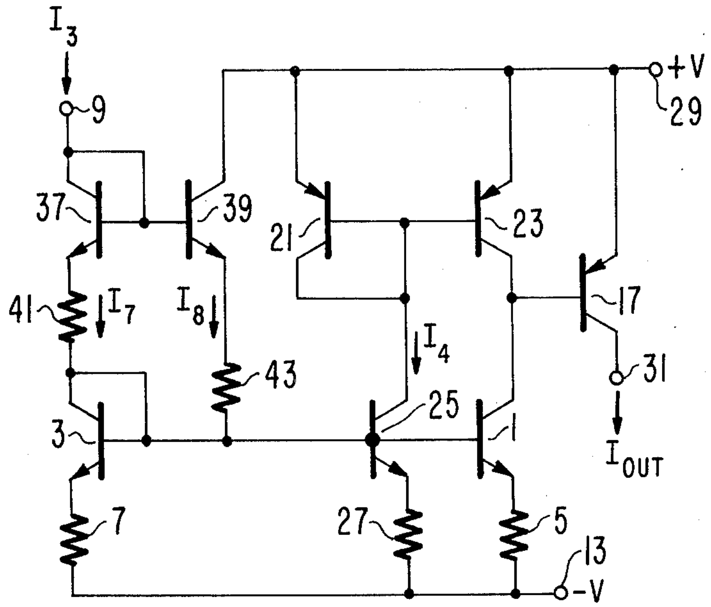
Figure 8:
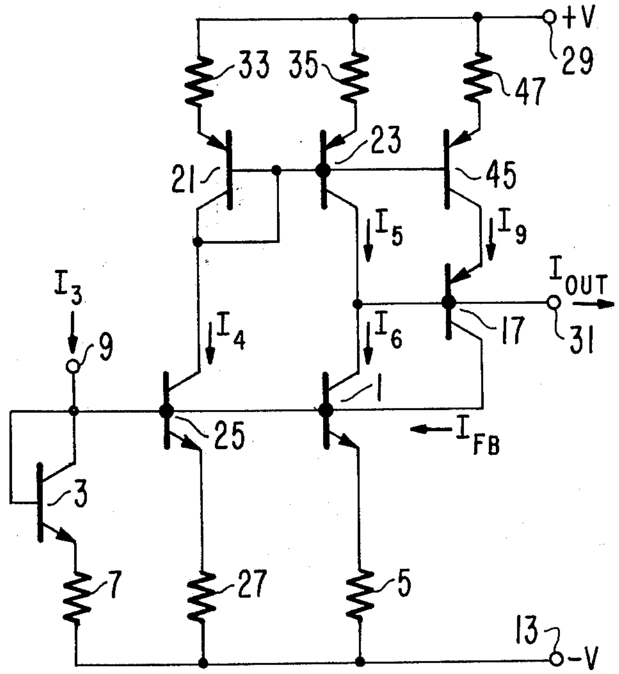
Figure 9:
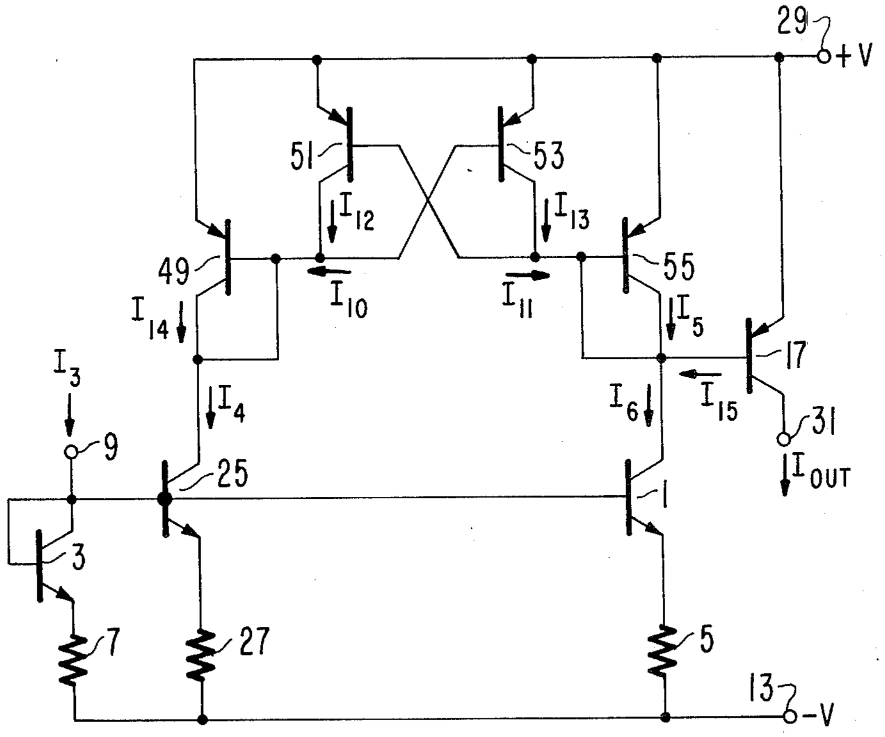

FIGS. 6 (*a*) and (*b*) are diagrams of operating or current transfer curves for various elements of the second embodiment of the invention;

FIG. 7 is a schematic circuit diagram of a third embodiment of the invention;

FIG. 8 is a schematic circuit diagram of a fourth embodiment of the invention; and FIG. 9 is a schematic circuit diagram of a fifth embodiment of the invention.

Figure 1:
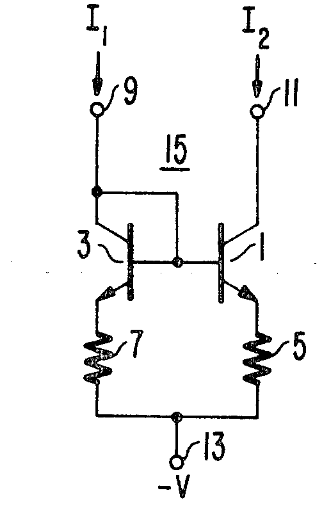
FIG. 1 is a schematic circuit diagram of a repetitive element of the various embodiments of the invention.

In FIG. 1, transistors 1 and 3, resistors 5 and 7, input terminal 9, output terminal 11, and common terminal 13, comprise a two-ratio current mirror. Output NPN transistor 1 has a collector electrode connected to the output terminal 11, an emitter electrode connected via resistor 5 to the common terminal 13, and a base electrode connected in common with the base and collector electrodes of the input NPN transistor 3 to input terminal 9. The emitter electrode of transistor 3 is connected via resistor 7 to the common terminal 13. A negative voltage supply −V is connected to the common terminal 13, and serves as a point of reference potential.

In operation, the two-ratio current mirror 15 can be designed to have any one of a plurality of current transfer characteristics, such current transfer characteristics being determined by the ratio n between the base-emitter junction areas of transistors 1 and 3, and the ratio of the values of the resistors 5 and 7. For magnitudes of input signal current insufficient to cause a voltage drop across the emitter resistors 5, 7, which is large compared to the voltage differential $$\left[\frac{KT}{q}\ln(n)\right]$$

between the $V_{BE}$'s of transistors 1 and 3, if operating at the same current levels, the transfer characteristic of the mirror is primarily controlled by the ratio of the base emitter junction area of transistor 1 to that of transistor 3 (where K=Boltzman's constant, T=absolute temperature, $q$=charge on electron). When the input signal current applied to terminal 9 achieves an amplitude sufficient to cause the voltage drops across the resistors to be large compared to the aforesaid $V_{BE}$ differential, the current transfer characteristic is determined by the degenerative feedback across the resistors, which in turn is a function of the ratio of resistor 5 to resistor 7.

Figure 2:
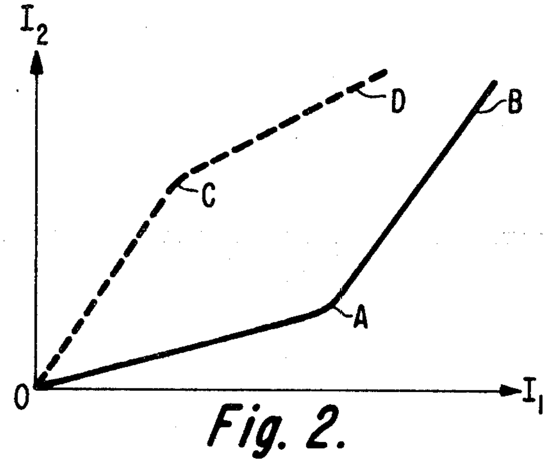
FIG. 2 is a diagram of two different operating curves or current transfer function curves, for example, that can be obtained from the circuit of FIG. 1.

The operation above is illustrated by the curves of FIG. 2. They represent the circuit transfer characteristic, that is, the value of the output signal current $I_2$ relative to the input signal current $I_1$. Section OC of dashed curve OCD is obtained for low values of input signal $I_1$, when the base-emitter junction area of transistor 1 is made greater than the corresponding area of transistor 3. In this case, for the range of input signal current $I_1$ from O to C, the output signal current magnitude $I_2$ increases at a faster rate than the input signal current $I_1$. For values of input signal current $I_1$ beyond the breakpoint C, transistors 1 and 3 conduct sufficiently that substantial degenerative feedback occurs across the emitter resistors 5 and 7. The ratio of currents $I_2/I_1$ is dependent upon the ratio of the values of these resistors. In this example, the value of resistor 5 is greater than the value of resistor 7, so that when operating in the degenerative region illustrated by CD, the input signal current $I_1$ increases at a greater rate than the output signal current $I_2$.

Of course, the slope of section OC of curve OCD can be changed to a value different than that shown by adjusting the value of the base-emitter junction area ratio of transistor 1 to transistor 3, and the slope of section CD of curve OCD can be changed by adjusting the ratio of the values of resistor 5 to resistor 7. For example, the transfer characteristic OAB may be obtained by making the base-emitter area of transistor 3 greater than the base-emitter area of transistor 1.

Figure 3:
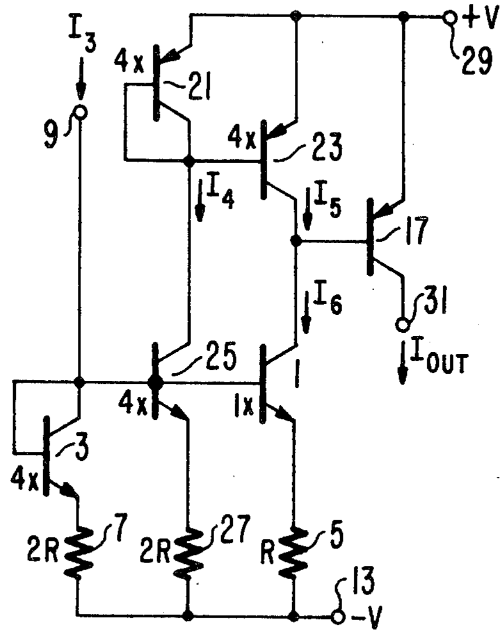
FIG. 3 is a schematic circuit diagram of one embodiment of the invention.

FIG. 3 illustrates a signal level detector according to one embodiment of the invention, which employs a two-ratio current mirror (1, 3, 7, 5), other current mirror amplifiers and an output transistor 17. The two-ratio current mirror (1, 3, 7, 5) operates as a current sink, the current demand of which is controlled by the input current signal $I_3$. The current mirror 21, 23 operates as a current source.

The PNP transistor 21 of FIG. 3 has its base and collector electrode connected in common to the base and collector electrodes of PNP transistor 23 and NPN transistor 25, respectively. The emitter electrodes of transistors 21, 23, and 17 are connected in common to voltage supply or power terminal 29, the latter being connected to a positive voltage source +V. The collector electrodes of transistors 1 and 23 are connected in common to the base electrode of transistor 17. The collector electrode of transistor 17 is connected to an output terminal 31. Transistor 25 has a base electrode connected in common to the base electrodes of transistors 1 and 3 and input terminal 9, and an emitter electrode connected via resistor 27 to common terminal 13. A point of reference potential −V is connected to common terminal 13. While in this example, transistors 1, 3, and 25 are NPN transistors, whereas transistors 17, 21, and 23 are PNP transistors, of course the conductivities of the various transistors can be reversed, along with the polarities of the voltage supplies.

For the purposes of explanation, assume in the circuit of FIG. 3: (a) the base emitter junction areas of transistors 3 and 25 are four times as great as that of transistor 1 (indicated by the legends 4*x* and 1*x*) and the areas of transistors 21 and 23 are equal; and (b) that the values of resistors 7 and 27 are twice as great as the value of resistor 5. Other combinations of base-emitter areas and values of resistances are, of course, possible and feasible.

In operation, an input signal current $I_3$ is applied to input terminal 9. This causes the first output transistor 25 of the mirror to demand an equal output current $I_4$, and the second output transistor 1 of the mirror to demand an output current $I_6$, which is smaller in value of $I_3$, for values below the crossover. When $I_3$ is of sufficient magnitude to cause the mirror 3, 1 to go into degenerative operation $I_6$ will become greater than $I_3$ by the ratio of resistor 7 to 5, when well into the degenerative mode. Transistor 25 acts as a current sink for transistor 21, that is, the magnitude of the combined collector and base currents supplied by transistor 21 to the collector electrode of transistor 19 is equal to $I_4$. Since transistor 21 forms a unity gain current mirror with transistor 23, the latter providing the output circuit of the mirror, the collector current $I_5$ of transistor 23 is substantially equal to the magnitude of the collector current $I_6$, until the degenerative region is reached for mirror 1, 3, whereupon $I_5$ will then be substantially equal to the magnitude of the collector current $I_4$ of input transistor 21. The collector current $I_5$ of transistor 23 is supplied as a source current to the collector electrode of output transistor 1 acting as a current sink.

Figure 4:
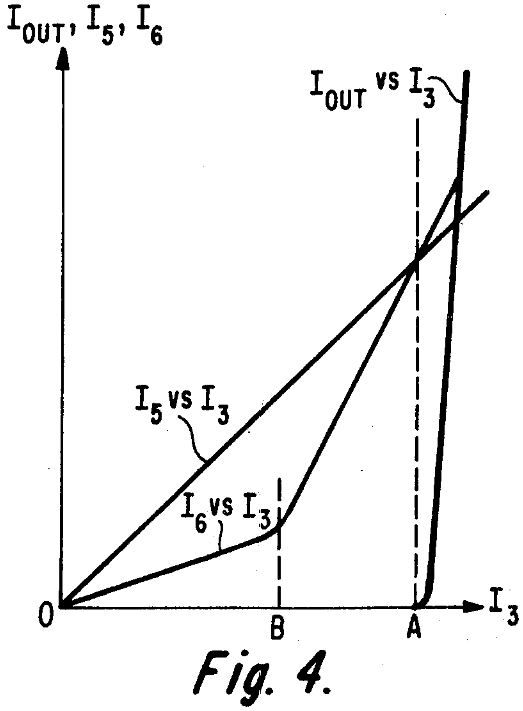
FIG. 4 is a diagram of an operating curve, for the circuit of FIG. 3.

For low values of input signal current $I_3$, i.e. below magnitude B of FIG. 4, the collector current $I_6$ demanded by transistor 1 is $I_3/4$, because the base-emitter junction area of transistor 1 is, in this example, one quarter that of transistor 3. Accordingly, for magnitudes of input signal current $I_3$ less than A, transistor 23 can supply all of the current demanded by the collector-emitter current path of output transistor 1.

When the magnitude of the input signal current $I_3$ exceeds the value B, transistors 1 and 3 are placed sufficiently into conduction for a breakpoint to occur in the transfer characteristic, causing the ratio of resistors 5 and 7 to now substantially determine the transfer characteristic of the current mirror formed by transistors 1 and 3. Accordingly, for magnitudes of input signal current greater than a value B, transistor 1 begins to demand successively greater collector current from the collector of transistor 23, at a faster rate of increase than the rate of increase of collector current $I_5$ capable of being supplied by transistor 23. When the input signal current $I_3$ reaches the value A, transistor 5 is "sinking" the entire collector current being supplied by transistor 23, and when $I_3$ becomes greater than A, transistor 23 can no longer supply the entire current demanded by transistor 1. As a result, transistor 1 begins to draw base current from detector transistor 17.

At a value of input signal current only slightly greater than A, sufficient base current is drawn from transistor 17 to switch this transistor from its "off" to its highly conducting state. In the latter, collector current $I_{out}$ flows to output terminal 31, and from there to a load (not shown) such as an indicator circuit, which may be coupled between terminal 31 and 13.

When the magnitude of the input signal current $I_3$ drops back to the value A (that is, substantially equal to A), transistor 17 cuts off. At this point, transistor 23 is again able to supply all of the collector current demanded by transistor 1, and the base current flow from transistor 17 terminates.

Figure 5:
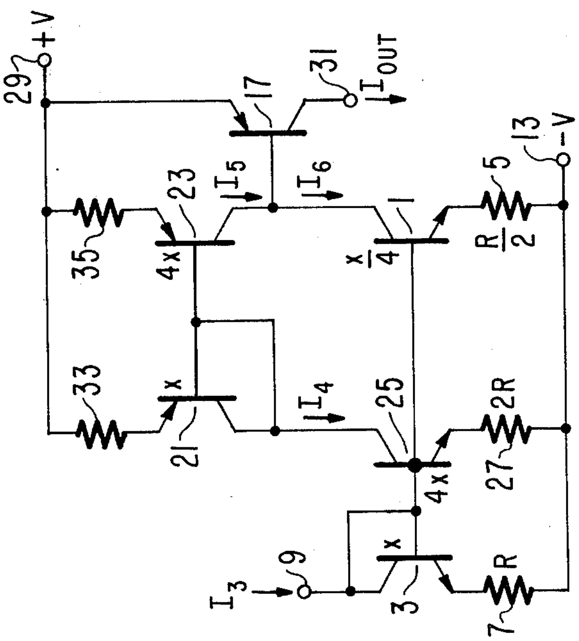
FIG. 5 is a schematic circuit diagram of a second embodiment of the invention.

In the circuit of FIG. 5, the signal current level detector of FIG. 3 has been improved by adding emitter resistors 33 and 35 between power terminal 29 and the emitter electrodes of transistors 21 and 23, respectively. The addition of emitter resistors 33 and 35, permits the current source including the current mirror formed by transistors 21 and 23, to operate as a two-ratio current mirror, for providing a more rapid turn-on of and a more accurately determinable threshold point for transistor 17. The values of the other resistors 5, 7, and 27, and the ratios between the base-emitter junction areas of transistors 3 and 25, 3 and 1, and 21 and 23, have been modified to attain the current transfer functions shown in FIGS. 6 (*a*) and (*b*), as will be presently described.

If the base-emitter junction area of NPN transistor 25 is made greater than the base-emitter junction area of NPN transistor 3, then the current transfer curve $I_4$ v. $I_3$ for magnitudes of input signal current less than B (see FIG. 6*b*) will appear as OL of transfer curve OLT. Notice that the collector current $I_4$ of transistor 25 increases at a greater rate than input signal current $I_3$. Resistor 27 is made greater in value than resistor 7, resulting in the transfer characteristic beyond the breakpoint L appearing as section LT of transfer curve OLT. Therefore, for magnitudes of input signal current $I_3$ greater than B, the collector current $I_4$ of transistor 25 will increase at a slower rate than the input signal current $I_3$.

If for the current mirror formed by NPN transistor 3, NPN transistor 1, and resistors 7 and 5, the base-emitter junction area of transistor 1 is made substantially less than the base-emitter junction area of transistor 3, and resistor 5 is made substantially smaller in value than resistor 7, the current transfer curve for this two-ratio current mirror will be curve OMR. For magnitudes of input signal current $I_3$ less than B, the collector current $I_6$ of transistor 1 increases at a slower rate than the input signal current $I_3$, whereas for input signal current $I_3$ magnitudes greater than B, the converse is true (see curve OMR). Typical relative values of resistors 7, 27, and 5 (R, 2R), and typical base-emitter junction area ratios (1X, 4X) for the current mirror transistors are noted on the figure.

For the two-ratio current mirror formed by NPN transistors 21 and 23, and resistors 33 and 35, the base-emitter junction area of transistor 23 is made substantially larger than the base-emitter area of transistor 21, and resistor 35 is made greater in value than resistor 33. As a result, the current transfer curve for the collector current $I_5$ of transistor 23 to the collector current $I_4$ of transistor 21 will appear as curve OXY (see FIG. 6*a*). Collector current $I_5$ of transistor 23 increases at a much faster rate than the collector current $I_4$ of transistor 21, for values of input signal current $I_3$ less than B, whereas for magnitudes of signal input current $I_3$ greater than B, the converse is true. Curve OKS is the transfer curve for $I_5$ v. $I_3$, showing that $I_5$ increases at a faster rate than $I_3$, for values of $I_3$ less than B, and at a slower rate than $I_3$, for values of $I_3$ greater than B.

In the operation of the circuit of FIG. 5, when the input signal current $I_3$ has a magnitude less than B, the collector current $I_5$ of transistor 23 is much greater than the collector current $I_6$ demanded by current sink transistor 1. Accordingly, PNP transistor 17 is cutoff. When the input signal current reaches a value greater than B, transistor 1 and 23 begin to operate in their second or degenerative mode. Now the collector current $I_5$ supplied by PNP transistor 23 to NPN transistor 1 increases at a much slower rate than the rate of increase of the collector current demanded by sink transistor 1. Accordingly, when the input signal current $I_3$ attains a magnitude A, sink transistor 1 will begin demanding a substantially greater collector current $I_6$ than source transistor 23 is capable of supplying. Sink transistor 1, then begins to draw base current from PNP output transistor 17, to satisfy its excess current demand, turning on transistor 17 in the process. As in the previous circuit, the turn on is very rapid and the point at which the turn on occurs is more accurately ascertainable and reproducible than in the previous circuit. The reason is that the two curves MR and KS intersect at an angle closer to 90° than in the circuit of FIG. 3, 90° being an optimum point for accurate threshold performance.

The transfer curve shown in FIGS. 6(*a*) and (*b*) are for purposes of explanation only. The breakpoints X of transfer curve OXY, K of transfer curve OKS, L of transfer curve OLT, and M of transfer curve OMR were all chosen to occur at a magnitude B of signal input current $I_3$, for ease of presentation. Of course, this is not a necessary requirement, and as mentioned previously, the various slopes for the transfer curves of the different two-ratio current mirrors in the circuit of FIG. 5 can be varied by appropriate selection of base-emitter junction areas, and values of emitter resistors. Optimization of the performance of the signal current level detector can be attained by appropriate adjustment of these base-emitter area ratios and ratios between the values of the emitter resistors.

The circuit for the signal current level detector of FIG. 3, can be improved upon as shown in FIG. 7, where a two-ratio current mirror including NPN transistors 37 and 39, and resistors 41 and 43, are included in the input circuit of the detector. Transistor 37 has base and collector electrodes connected in common to signal input terminal 9, and the base electrode of transistor 39. Transistor 39 has a collector electrode connected to the power input or voltage supply terminal 29, and an emitter electrode connected via resistor 43 to the commonly connected base electrodes of transistors 1, 7, and 25. Also, transistor 37 has an emitter electrode connected via resistor 41 to the common connection of the collector and base electrodes of transistor 3.

In the operation of the circuit of FIG. 7, the input current $I_7$ and the output current $I_8$, of the two-ratio current mirror 37, 39, 41, and 43 are combined to provide an input signal current to input transistor 3 of the two other two-ratio current mirrors, one including transitors 3 and 25, and the other including transistors 3 and 1. If the base-emitter junction area of transistor 37 is made greater than the base-emitter junction area of transistor 39, and the value of resistor 43 is greater than the value of resistor 41, an increase in the change of slope at the breakpoint or threshold value of the current magnitude of signal input current $I_3$ to be detected can be obtained. For instance, the geometries of transistors 37 and 39, and the actual value of resistors 41 and 43, can be adjusted to provide that when the magnitude of the signal input current $I_3$ exceeds a given value, the combined magnitude of the input and output current $I_7$ and $I_8$ will greatly increase, enhancing the sensitivity of the detector, that is, decreasing the switching point of transistor 17 and improving the threshold detection accuracy.

The circuit of FIG. 5 can be modified as shown in FIG. 8, to provide a signal current level detector having hysteresis. In the circuit of FIG. 8, a PNP transistor 45 and a resistor 47 have been added. Transistor 45 has a base electrode connected to the base electrode of transistor 23, an emitter electrode connected via resistor 47 to power terminal 29, and a collector electrode connected to the emitter electrode of transistor 17. The interconnection of transistor 17 has also been modified, where now transistor 17 has its base electrode connected in common to the collector electrodes of transistors 23 and 1, and to the output terminal 31. The collector electrode of transistor 17 is connected to the base electrode of transistor 1, for providing a feedback current $I_{FB}$ to the current sink of transistors 3 and 1, and resistors 5 and 7.

In operation, the circuit of FIG. 8 exhibits hysteresis with respect to its input signal current, in a manner analogous to the operation of a Schmitt trigger with respect to an input voltage signal. The value of resistor 47 is made much greater than the values of resistors 33 and 35, insuring that when the magnitude of the input signal current $I_3$ exceeds the threshold or detecting value A, that the collector current $I_9$ available from transistor 45 increases at a slower rate than the input signal current $I_3$ in a range of magnitude greater than a given value. Operation of the circuit of FIG. 8 is similar to the operation of the circuit of FIG. 5, except that for input signal current levels having magnitudes below A, for example, a portion of the collector current $I_5$ of transistor 23 is delivered to a load impedance (not shown) connected between output terminal 31 and the point of reference potential −V. As a result, the voltage appearing between output terminal 31 and the point of reference −V, for magnitudes of input signal current less than A, will be positive or indicative of a digital "one."

When the input signal current attains or exceeds a magnitude A, the magnitude of the collector current $I_6$ demanded by transistor 1 will become greater than the magnitude of the collector current $I_5$ being supplied by source transistor 23, causing transistor 1 to draw base current from transistor 17. As a result, transistor 17 will be rapidly placed into a high conduction state, causing a collector current $I_{FB}$ of transistor 17 to be fed back to and summed with the signal input current $I_3$. Also, when the collector current $I_6$ demanded by transistor 1 exceeds the source or collector current $I_5$ of transistor 23, transistor 1 will begin to draw current from the load connected across output terminal 31 and the point of reference potential −V, causing the voltage at output terminal 31 to go negative or be a digital 0. When the input signal current reduces in magnitude to a value of A, transistor 17 will continue to be in conduction, for the feedback current $I_{FB}$ being fed back to the input circuit of the detector is additive with the magnitude of the signal input current $I_3$. In other words, the output signal at terminal 31 will not change state, or transistor 17 will not become cutoff, until such time that the magnitude of the input signal current $I_3$ decreases to a value $I_{FB}$ less than A. In this manner, hysteresis is provided for the signal current level detector. The value of resistor 47 is made much greater than the values of resistors 33 and 35. When transistor 17 is not conducting, transistor 45 behaves as a diode by virtue of its base-emitter junction supplying a small value of current to the base electrodes of transistors 21 and 23. The high value of resistor 47 prevents this base current from disturbing the mirror ratio of the current mirror formed by transistors 21 and 23, and resistors 33 and 35. Transistor 45 can be buffered by a Darlington amplifier connected between the base electrode of transistor 45 and the base electrodes of transistors 21 and 23, so as to further diminish spurious loading of transistors 33 and 35. The points of transition at which the signal current level detector will set and reset can be readily calculated from the values of the mirror resistors and the geometries of the transistors 1, 3, 17, 21, 25, 23, and 47.

In the circuit of FIG. 9, a signal current level detector is obtained with hysteresis, by using a current sink of transistors 1 and 3, and resistors 5 and 7, interconncted as a two-ratio current mirror, substantially identical to the current sinks of the previous circuits. Also, as in the circuits of FIGS. 3, 5, 7, and 8, transistor 25 and resistor 27 are included as a current sink or current reference forming a current mirror in combination with transistor 3 and resistor 7.

In the circuit of FIG. 9, a cross-coupled current mirror including PNP transistors 49, 51, 53, and 55, is connected as a current source. Transistor 49 has a base and collector electrode connected in common with the collector electrode of transistor 25, and the collector and base electrodes of transistors 51 and 53, respectively. Transistors 49, 51, 53, and 55 each have an emitter electrode connected to the power terminal 29. Transistor 53 also has a collector electrode connected in common with the base electrode of transistor 51, the base and collector electrodes of transistor 55, the collector electrode of transistor 1, and the base electrode of transistor 17. The emitter electrode of transistor 17 is connected to the power terminal 29, and the collector electrode of transistor 17 is connected to output terminal 31.

In operation, assume that the input signal current $I_3$ has zero magnitude. Transistors 25 and 1 are cutoff, and no collector current $I_4$ or $I_6$, respectively, is demanded from the current source 49, 51, 53, 55.

As the signal input current $I_3$ begins to rise in magnitude above zero, the geometries of transistors 25 and 1 are such that the collector current demand $I_4$ of transistor 25 increases at a faster rate with respect to increases in signal current $I_3$, than does the collector current demand $I_6$ of transistor 1. As a result, the collector current demand $I_4$ of transistor 25, is substantially greater than the collector current demand $I_6$ of transistor 1. Therefore, assuming substantially similar geometries of the transistors 49, 51, 53, and 55 of the current source, transistor 49 supplies a collector current $I_{14}$ to meet substantially all of the current demand $I_4$ of transistor 25.

As the collector current $I_{14}$ of transistor 49 increases, this current is mirrored by transistor 53, causing the collector current $I_{13}$ of transistor 53 to increase in value to substantially that of $I_{14}$. Of course, the base current $I_{10}$ of transistor 53 also increases in value to equate the base-emitter voltage drops of transistors 49 and 53. As the collector current $I_{13}$ of transistor 53 increases, the collector-emitter voltage of this transistor decreases, causing the base-emitter voltage of transistor 55 to decrease, reducing the conduction of and collector current $I_5$ of transistor 55. The described operation is regenerative, causing transistors 55 and 51 to become cutoff, and transistors 49 and 53 to be in high conduction states for supplying substantially all the collector current demands $I_4$, $I_6$, of transistors 25 and 1, respectively. This condition prevails for a first range of magnitudes of signal input current $I_3$. It should be noted that a portion of the collector current demand $I_4$ of transistor 25 is supplied by the base current $I_{10}$ of transistor 53, providing hysteresis.

When the magnitude of the input signal current $I_3$ exceeds a given value, and enters a second range of magnitudes, the mirror ratio for transistors 3 and 25, and 3 and 1, will no longer be controlled by their respective geometries, but by the values of their respective emitter resistors 7, 27, and 5. The resistor values of resistors 7, 27, and 5 are such that the collector current $I_6$ will now increase at a much faster rate than the collector current $I_4$. When $I_3$ reaches a given threshold value, transistor 53 becomes unable to supply all of the collector current $I_6$ demand of transistor 1, causing transistor 55 to go into conduction, providing collector current $I_5$. In turn, transistor 17 is mirrored by transistor 55, and also goes into conduction supplying base current $I_{15}$, which in combination with collector current $I_5$ of transistor 55, now begins to supply a portion of the collector current demand $I_6$ of transistor 1. Conduction of transistor 17 causes the collector current $I_{OUT}$ of this transistor to be delivered to output terminal 31, providing an output signal.

Since transistor 55 also forms a current mirror with transistor 51, as transistor 55 goes into conduction, transistor 51 similarly goes into conduction providing a collector current $I_{12}$. This collector current $I_{12}$ now begins to provide a portion of the collector current $I_4$ demand of transistor 25, decreasing the magnitude of collector current $I_{14}$ required to provide $I_4$. Also, the collector-emitter voltage of transistor 51 reduces as this transistor goes into higher conduction states, causing the base-emitter voltage of transistors 49 and 53 to decrease, reducing the conductivity of transistors 49 and 53. This action is regenerative, causing transistors 49 and 53 to become cutoff. The result is that transistor 51 will now supply substantially all of the collector current demand $I_4$ of transistor 25. Also, the base currents $I_{11}$ and $I_{15}$, of transistors 51 and 17, and the collector and base currents of transistor 55 will substantially supply the collector current demand $I_6$ of transistor 1.

The base currents $I_{10}$ and $I_{11}$ of transistors 51 and 53, respectively, provide hysteresis. Therefore, when $I_{14}$ and $I_5$ crossover, the crossover current mirror switches, when the ratio between these base currents is slightly greater or less than 1. A more detailed description of the operation and hysteresis effect of a crossover current mirror can be found in Hodemaekers U.S. Pat. No. 3,805,093.

While in the specification and claims, the lower mirror 1, 3, 5 is stated to operate as a sink and the upper mirror(s) as a source, it is to be understood that these terms are being employed in their generic sense. Thus, if a different convention for current flow is adopted, what is termed a sink here becomes a source, and vice-versa. Similarly, using the same convention for current flow but changing the conductivities of the transistors (with corresponding changes in supply voltage polarities) the current sinks become current sources and vice-versa.

What is claimed is:

1. A signal current level detector comprising, in combination:
- a current sink controlled by said signal current for demanding a current in one proportion to said signal current when the latter is smaller than a given value, and in a second proportion to said signal current when the latter is greater than said given value;
- a current source controlled by said signal current, for supplying a current to said current sink in at least one proportion to said signal current;
- an auxiliary current source responsive to said current sink demanding more current than said current source can supply, for providing at least a portion of the additional current demanded by said current sink; and
- means for producing an output signal in response to operation of said auxiliary current source.

2. The combination of claim 1, wherein said current sink includes:
- a first current mirror amplifier having an input current path through which said signal current flows, and an output current path through which current from said current source and said auxiliary current source can flow.

3. The combination of claim 1, wherein said current source includes:
- a first current mirror amplifier having input and output current paths through each of which a current flows having a magnitude substantially equal to that of said signal current, the output current path supplying current to said current sink; and
- a second current mirror amplifier having an input current path through which said signal current flows, and an output current path connected in series with the input current path of said first current mirror.

4. The combination of claim 1, wherein said auxiliary current source includes:
- a source of voltage; and
- a semiconductor junction having a pair of electrodes connected between said source of voltage and current sink.

5. The combination of claim 4, wherein said output signal producing means includes:
- an output terminal; and
- a bipolar transistor having an emitter electrode connected to said voltage source, a base electrode connected to said current sink, and a collector electrode connected to said output terminal, said base and emitter electrodes forming said semiconductor junction, whereby when current flows through said semiconductor junction to said current sink, said transistor is placed into conduction, to provide a flow of current through the current path formed by its emitter-collector electrodes to the output terminal.

6. The combination of claim 1, wherein said current sink includes:
- a first NPN transistor having an emitter electrode, a collector electrode receptive of current from said current and auxiliary current sources, and a base electrode receptive of a portion of said signal current;
- a second NPN transistor having commonly connected base and collector electrodes receptive of a portion of said signal current, and an emitter electrode;
- a point of reference potential; and
- first and second resistors connected individually between the emitter electrodes of said first and second transistors, respectively, and said point of reference potential, said first resistor being substantially less in value than said second resistor, whereby when said signal current has a magnitude lower than said given value, said first transistor demands a collector current substantially lower in magnitude than said signal current, and when said signal current is greater than said given value, said first transistor demands a collector current substantially greater than said signal current.

7. The combination of claim 6, wherein said current source includes:
- a voltage source;
- first and second PNP transistors each having an emitter electrode connected in common to said voltage source, base electrodes connected in common to a collector electrode of said first PNP transistor, a collector electrode of said second PNP transistor being connected to the collector electrode of said first NPN transistor;
- a third NPN transistor having a collector electrode connected to the collector electrode of said first PNP transistor, an emitter electrode, and a base electrode connected to the base electrode of said second NPN transistor; and
- a third resistor connected between said point of reference potential and the emitter electrode of said third NPN transistor.

8. The combination of claim 6, wherein said auxiliary current source includes:
- a voltage source; and
- a PNP transistor having an emitter electrode connected to said voltage source, and a base electrode connected to the collector electrode of said first NPN transistor.

9. The combination of claim 6, wherein said output signal producing means includes:
- a voltage source;
- an output terminal; and
- a PNP transistor having an emitter electrode connected to said voltage source, a base electrode connected to the collector electrode of said first NPN transistor, and a collector electrode connected to said output terminal, whereby current is supplied to said output terminal via said collector electrode, whenever said first NPN transistor draws a base current from and of sufficient magnitude to turn-on said PNP transistor.

10. The combination of claim 6, wherein said current source includes:
- a voltage source;
- third, fourth, and fifth resistors;
- first and second PNP transistors each having individual emitter electrodes coupled to said voltage source via said fourth and fifth resistors, respectively, base electrodes connected in common to a collector electrode of said first PNP transistor, a collector electrode of said second PNP transistor being connected to the collector electrode of said first NPN transistor; and a third NPN transistor having a collector electrode connected to the collector electrode of said first PNP transistor, an emitter electrode coupled to said point of reference potential via said third resistor, and a base electrode connected to the base electrode of said second NPN transistor, the collector current of said second PNP transistor being in one or another proportion to said signal current, depending upon whether said signal current is greater than or less than said given value.

11. The combination of claim 6, wherein said current source includes:

a voltage source;

third, fourth, and fifth resistors;

a third NPN transistor having a collector electrode, a base electrode connected to the base electrode of said second NPN transistor, and an emitter electrode coupled via said third resistor to said point of reference potential;

fourth and fifth NPN transistors, each having a base electrode connected in common to a collector electrode of said fourth NPN transistor receptive of said signal current, an emitter electrode of said fourth NPN transistor being coupled via said fourth resistor to the collector electrode of said second NPN transistor, said fifth NPN transistor having a collector electrode connected to said voltage source, and an emitter electrode coupled via said fifth resistor to the base electrode of said third NPN transistor; and a PNP current mirror amplifier having a common terminal connected to said voltage source, an input terminal connected to the collector electrode of said third NPN transistor, and an output terminal connected to the collector electrode of said first NPN transistor.

12. The combination of claim 10, wherein said auxiliary current source includes:

a sixth resistor;

a third PNP transistor having an emitter electrode coupled via said sixth resistor to said voltage source, a base electrode connected to the base electrode of said second PNP transistor, and a collector electrode; and a fourth PNP transistor having an emitter electrode connected to the collector electrode of said third PNP transistor, a collector electrode, and a base electrode connected to the collector electrode of said first NPN transistor.

13. The combination of claim 12, wherein said output signal producing means includes:

an output terminal connected to the base electrode of said fourth PNP transistor; and the collector electrode of said fourth PNP transistor connected to the base electrode of said first NPN transistor for providing current feedback to said current sink, whereby an output signal at said output terminal will be in one of a plurality of conditions, for magnitudes of input signal current being in one of three ranges of current magnitude, respectively.

14. The combination of claim 6, wherein said current source includes:

a third resistor;

a third NPN transistor having a base electrode connected to the base electrode of said first NPN transistor, an emitter electrode coupled via said third resistor to said point of reference potential;

a voltage source; and first through fourth PNP transistors each having a base, a collector, and an emitter electrodes, the base and collector electrodes of said first PNP transistor being connected in common to the collector electrodes of said second PNP and third NPN transistors, and to the base electrode of said third PNP transistor, the base electrode of said second PNP transistor being connected in common to the collector electrodes of said third and fourth PNP and first NPN transistors, and to the base electrode of said fourth PNP transistor, whereby regenerative feedback is provided from the base electrodes of said first and fourth PNP transistors, causing a hysteresis effect for activating said auxiliary current source when the magnitude of said current signal goes from a first range to a second range of magnitudes, and for deactivating said current source when the magnitude of said current signal goes from the second range of magnitudes to a third range of magnitudes.

15. A current level detector comprising, in combination:

a first current mirror amplifier exhibiting a first ratio of output to input current in response to an input current within one range of values and a second higher ratio of output-to-input currents in response to an input current within a second range of values, said amplifier having an input terminal, an output terminal and a common terminal, an input current path between said input and common terminals responsive to an input current, and an output current path between said output and common terminals;

a second current mirror amplifier of complementary conductivity to said first current mirror amplifier, having an input terminal, an output terminal and a common terminal, an input current path between its input and common terminals responsive to a current of a value proportional to the input current supplied to the input terminal of said first current mirror amplifier, and an output current path connected between its common and output terminals, said output terminal connected to the output terminal of said first current mirror amplifier, said second current mirror amplifier exhibiting a current gain such that it supplies sufficient output current to meet the output current demand of said first current mirror amplifier, when said input current of said first current mirror amplifier is in said first range, and has a rate of increase of output current which is smaller than the rate of increase of output current of said first current mirror amplifier, when said input current to said first current mirror amplifier is in said second range; and means coupled to said output terminals for indicating when the output current demanded by said first current mirror amplifier exceeds the output current being supplied by said second current mirror amplifier.

16. The current level detector of claim 15, wherein said indicating means includes:

an output signal terminal; and a transistor of like conductivity to said second current mirror, having a base electrode connected to said commonly connected output terminals of said first and second current mirror amplifiers, an emitter electrode connected to the common terminal of said second current mirror amplifier, and a collector electrode connected to said output signal terminal.

17. The current level detector of claim 15, wherein said first current mirror amplifier further includes:

first and second resistors;

a first transistor having a base and a collector electrodes coupled to said input terminal of said first amplifier, and an emitter electrode coupled via said first resistor to said common terminal of said first amplifier; and a second transistor having a base electrode connected to the collector electrode of said first transistor, an emitter electrode coupled via said second resistor to said common terminal of said first amplifier, and a collector electrode connected to said output terminal of said second current mirror amplifier.

18. The current level detector of claim 15, wherein said second current mirror amplifier further includes:

a first transistor having an emitter electrode coupled to the common terminal of said second amplifier, and a base and a collector electrodes connected in common to the input terminal of said second amplifier; and a second transistor having a base electrode connected to the common connection of the base and collector electrodes of said first transistor, an emitter electrode coupled to said common terminal of said second amplifier, and a collector electrode connected to the output terminal of said second amplifier.

19. The current level detector of claim 18, wherein said second current mirror amplifier further includes:

first and second resistors, for coupling the emitter electrodes of said first and second transistors, respectively, to the common terminal of said second amplifier.

20. The current level detector of claim 17, wherein said first current mirror amplifier further includes:

a third resistor having one end connected in common to the base and collector electrodes of said first transistor;

a third transistor having an emitter electrode connected to the other end of said resistor, and a base and a collector electrode connected in common to the input terminal of said first amplifier;

a fourth transistor having a base electrode connected to the base electrode of said third transistor, a collector electrode connected to the common terminal of said second amplifier; and a fourth resistor connected between the emitter electrode of said fourth transistor and the commonly connected base electrodes of said first and second transistors.

21. The current level detector of claim 20, wherein said second current mirror amplifier further includes:

fifth and sixth transistors each having an emitter electrode connected to the common terminal of said second amplifier, a base electrode connected in common to a collector electrode of said fifth transistor and the input terminal of said second amplifier, and said sixth transistor having a collector electrode connected to the output terminal of said second amplifier.

22. The current level detector of claim 15, wherein said second current mirror amplifier further includes:

first and second resistors; and first and second transistors each having an emitter electrode coupled individually to the common terminal of said second amplifier via said first and second resistors, respectively, a base electrode connected in common to a collector electrode of said first transistor and the input terminal of said second amplifier, and a collector electrode of said second transistor being connected to an output terminal of said second amplifier.

23. The current level detector of claim 22, wherein said indicating means includes:

a third resistor; and third and fourth transistors of like conductivity to said first and second transistors; said third transistor having a base electrode connected to the base electrode of said second transistor, an emitter electrode coupled via said third resistor to the common terminal of said second amplifier, and a collector electrode; and said fourth transistor having an emitter electrode connected to the collector electrode of said third transistor, a base electrode connected to the output terminal of said first current mirror amplifier, and a collector electrode connected to the input terminal of said first amplifier, for providing hysteresis in the operation of said detector.

24. The current level detector of claim 15, wherein said second current mirror amplifier includes:

first through fourth transistors, each having a base, emitter, and collector electrodes; the emitter electrode of said first through fourth transistors being connected to the common terminal of said second amplifier; the base and collector electrodes of said first transistor being connected in common to the collector electrode of said second transistor, base electrode of said third transistor, and input terminal of said second amplifier; and the base and collector electrodes of said fourth transistor being connected in common to the base electrode of said second transistor, the collector electrode of said third transistor, and the output terminal of said second amplifier.

* * * * *